(12) United States Patent
Katabe et al.

(10) Patent No.: US 8,529,089 B2
(45) Date of Patent: Sep. 10, 2013

(54) LIGHT EMITTING DEVICE AND ILLUMINATION DEVICE

(75) Inventors: Kousuke Katabe, Higashiomi (JP); Yuki Mori, Higashiomi (JP); Akira Miyake, Higashiomi (JP); Shingo Matsuura, Higashiomi (JP)

(73) Assignee: Kyocera Corporation, Kyoto (JP)

( * ) Notice: Subject to any disclaimer, the term of this patent is extended or adjusted under 35 U.S.C. 154(b) by 209 days.

(21) Appl. No.: 12/810,769

(22) PCT Filed: Dec. 26, 2008

(86) PCT No.: PCT/JP2008/073858
§ 371 (c)(1),
(2), (4) Date: Dec. 14, 2010

(87) PCT Pub. No.: WO2009/082011
PCT Pub. Date: Jul. 2, 2009

(65) Prior Publication Data
US 2011/0096526 A1   Apr. 28, 2011

(30) Foreign Application Priority Data
Dec. 26, 2007   (JP) .................. 2007-333621

(51) Int. Cl.
*F21S 4/00*   (2006.01)
(52) U.S. Cl.
USPC ............ 362/225; 362/219; 362/238; 257/98
(58) Field of Classification Search
USPC ............ 262/84, 249.02; 362/84, 97.1, 97.3, 362/217.01, 217.02, 217.05, 219, 221–227, 362/249.01, 249.02, 294, 326–328, 346, 362/373,800, 812, 235, 240, 241, 244, 245; 257/98–100, 676, E23.009, E25.02, E25.032, 257/E33.072, 79, 81, 82, 95, 774; 313/499, 313/500, 512
See application file for complete search history.

(56) References Cited

U.S. PATENT DOCUMENTS 5,144,536 A * 9/1992 Tsukada et al. ............... 361/765
6,930,332 B2 * 8/2005 Hashimoto et al. ............. 257/98
(Continued)

FOREIGN PATENT DOCUMENTS
EP   1496551 A2   1/2005
EP   1686630 A2   8/2006
(Continued)

OTHER PUBLICATIONS

Taiwanese language office action dated Sep. 15, 2011 and its English language translation for corresponding Taiwanese application 097151292.
(Continued)

Primary Examiner — Hargobind S Sawhney
(74) Attorney, Agent, or Firm — DLA Piper LLP (US)

(57) ABSTRACT

A light emitting device includes a base, a sub-mount substrate, and a frame member. The light emitting device further includes a light emitting element and a wavelength converting member. The sub-mount substrate is disposed on the base, and has an upper surface made of a ceramic sintered body. The frame member has a light reflecting portion made of porous ceramics, is disposed on the base, and surrounds the sub-mount substrate. The light emitting element is mounted on the sub-mount substrate. The wavelength converting member covers the light emitting element and the light reflecting portion of the frame member.

2 Claims, 5 Drawing Sheets

(56) References Cited

U.S. PATENT DOCUMENTS

| | | |
|---|---|---|
| 7,495,322 B2 * | 2/2009 | Hashimoto et al. ............ 257/676 |
| 7,534,002 B2 * | 5/2009 | Yamaguchi et al. ............ 362/84 |
| 8,070,316 B2 * | 12/2011 | Urano et al. ............ 362/249.02 |
| 2005/0133808 A1 * | 6/2005 | Uraya et al. ............ 257/99 |
| 2007/0058357 A1 * | 3/2007 | Yamaguchi et al. ............ 362/84 |
| 2007/0235746 A1 | 10/2007 | Mitsuyama et al. |
| 2007/0262335 A1 * | 11/2007 | Kumei et al. ............ 257/98 |
| 2008/0112165 A1 * | 5/2008 | Mori et al. ............ 362/241 |
| 2009/0046456 A1 | 2/2009 | Urano et al. |
| 2009/0213591 A1 | 8/2009 | Katabe et al. |

FOREIGN PATENT DOCUMENTS

| | | |
|---|---|---|
| JP | 6051475 U | 4/1985 |
| JP | 2005191196 A | 7/2005 |
| JP | 2007-012993 | 1/2007 |
| JP | 2007059371 A | 3/2007 |
| JP | 2007-142051 | 6/2007 |
| JP | 2007-226034 | 9/2007 |
| JP | 2007-227868 | 9/2007 |
| WO | 2006104061 A1 | 10/2006 |
| WO | WO 2007072919 A1 * | 6/2007 |

OTHER PUBLICATIONS

Extended European search report dated Mar. 28, 2013 issued in corresponding European application 08863988.5 cites the U.S. patent application publication and foreign patent documents listed above.

* cited by examiner

LIGHT EMITTING DEVICE AND ILLUMINATION DEVICE

CROSS REFERENCE TO RELATED APPLICATION

This application is a national stage of international application No. PCT/JP2008/073858 filed on Dec. 26, 2008, which also claims priority to and the benefit of Japanese Patent Application No. 2007-333621 filed Dec. 26, 2007, the entire content of which are incorporated herein by reference.

TECHNICAL FIELD

The present invention relates to a light emitting device and illumination device having a light emitting element such as a light emitting diode.

BACKGROUND ART

In recent years, the development of a light emitting device having a light emitting element such as a light emitting diode is progressing in the field of illumination, and the like. This light emitting device has a wavelength converting member that converts the wavelength of a light emitted by the light emitting element. Hereinafter, a further improvement in light emitting efficiency in the light emitting device is required.

DISCLOSURE OF INVENTION

In order to improve the light emitting efficiency in the light emitting device, it is necessary to improve the efficiency of the wavelength conversion of the light emitted by the light emitting element. Generally, there is a tendency for light radiated downward from the light emitting element to arrive at a specific portion of the wavelength converting member with bias. In order to improve the efficiency of the wavelength conversion with the wavelength converting member, it is necessary to reduce the bias of the light radiated downward from the light emitting element.

According to one aspect of the invention, a light emitting device includes a base, a sub-mount substrate, and a frame member. The light emitting device further includes a light emitting element and a wavelength converting member. The sub-mount substrate is disposed on the base, and has an upper surface made of a ceramic sintered body. The frame member has a light reflecting portion made of porous ceramics, is disposed on the base, and surrounds the sub-mount substrate. The light emitting element is mounted on the sub-mount substrate. The wavelength converting member covers the light emitting element and the light reflecting portion of the frame member.

According to another aspect of the invention, a light emitting device includes a light emitting element that emits a primary light, a first light reflecting portion, and a second light reflecting portion. The light emitting device further includes a wavelength converting member. The first light reflecting portion is disposed immediately below the light emitting element, and reflects the primary light. The second light reflecting portion surrounds the first light reflecting portion, and scatters the primary light. The wavelength converting member emits a secondary light in dependence on the primary light.

According to another aspect of the invention, an illumination device includes a base including a metallic material, a sub-mount substrate, and a plurality of frame members. The illumination device further includes a plurality of light emitting elements and a plurality of wavelength converting members. The sub-mount substrates are disposed on the base, and each have an upper surface made of a ceramic sintered body. The plurality of frame members are disposed on the base, and each surround one of the sub-mount substrates, and has a light reflecting portion made of porous ceramics. The plurality of light emitting elements are mounted on the plurality of sub-mount substrates. Each of the plurality of wavelength converting members covers one of the light emitting elements and one of the light reflecting portions.

According to another aspect of the invention, an illumination device includes a substrate having a conductor pattern, a plurality of bases, and a plurality of sub-mount substrates. The illumination device includes a plurality of frame members, a plurality of light emitting elements, and a plurality of wavelength converting members. The plurality of bases are disposed on the substrate, and include a metallic material. The plurality of sub-mount substrates are disposed on the plurality of bases, and each have an upper surface made of a ceramic sintered body. The plurality of frame members are disposed on the plurality of bases, and each surround one of the sub-mount substrates, and each have a light reflecting portion made of porous ceramics. The plurality of light emitting elements are mounted on the plurality of sub-mount substrates, and are electrically connected to the conductor pattern. Each of the plurality of wavelength converting members covers one of the light emitting elements and one of the light reflecting portions.

BRIEF DESCRIPTION OF DRAWINGS

Other and further objects, features, and advantages of the invention will be more explicit from the following detailed description taken with reference to the drawings wherein.

BEST MODE FOR CARRYING OUT THE INVENTION

Figure 1:
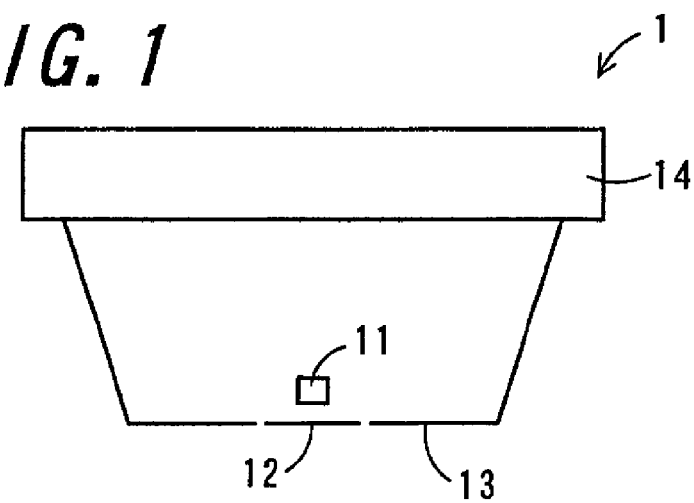
FIG. 1 illustrates a concept of the invention.

Hereinafter, the concept of the invention will be described, referring to FIG. 1. A light emitting device 1 includes a light emitting element 11, a first light reflecting portion 12, and a second light reflecting portion 13. The light emitting device 1 further includes a wavelength converting member 14. The light emitting element 11 emits a primary light. The first light reflecting portion 12 is disposed immediately below the light emitting element 11, and reflects the primary light. The second light reflecting portion 13 surrounds the first light reflecting portion 12, and reflects the primary light. The second light reflecting portion 13 scatters the primary light. The wavelength converting member 14 emits a secondary light in dependence on the primary light.

Figure 2:
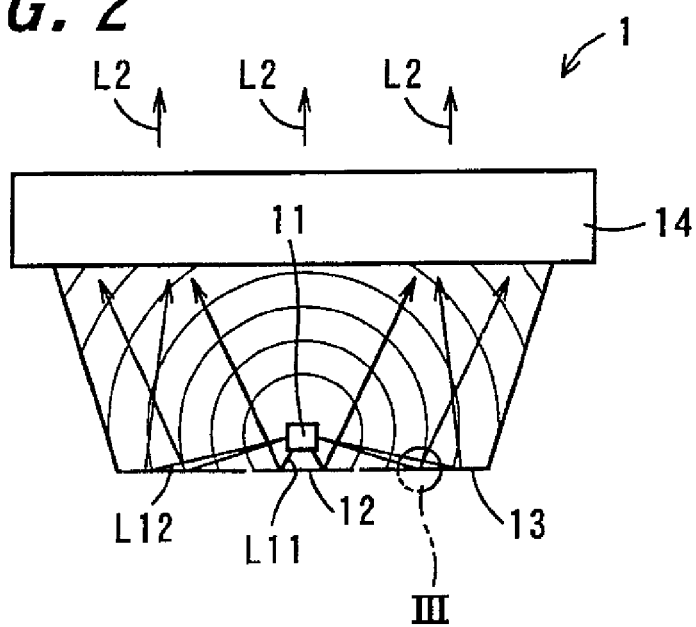
FIG. 2 illustrates a light emitting structure of a light emitting device 1 illustrated in FIG. 1.

A light emitting structure in the light emitting device 1 will be described, referring to FIG. 2. The intensity of the primary light emitted from the light emitting element 11 diminishes as it is farther from the light emitting element 11. The first light reflecting portion 12 reflects relatively intense a primary light L11. The primary light L11 is specularly reflected. The second light reflecting portion 13 reflects relatively weak a primary light L12. The primary light L12 is scattered. The wavelength converting member 14 emits a secondary light L2 in dependence on the primary light emitted from the light emitting element 11, including the lights L11 and L12 reflected by the first light reflecting portion 12 and second light reflecting portion 13. The exemplified secondary light L2 is white light.

Figure 3:
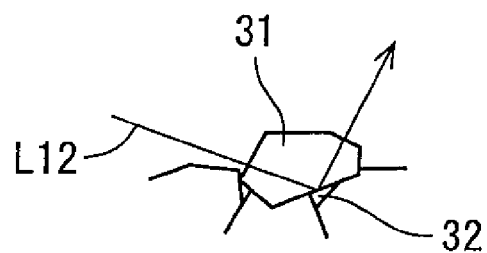
FIG. 3 illustrates an enlarged view of a portion indicated by reference numeral III of FIG. 2.

Details of the portion indicated by reference numeral III in FIG. 2 will be described, referring to FIG. 3. The second light reflecting portion 13 is made of a plurality of inorganic particles 31 having a tranparence. The "transparence" of the inorganic particles 31 means that at least a part of wavelengths of the light emitted from the light emitting element 11 is transmitted. The second light reflecting portion 13 has a plurality of mediums 32 of a smaller refractive index than that of the inorganic particles 31. Examples of the mediums 32 are air, a resin material, or a glass material. The light L12 is transmitted through the inorganic particles 31. The light L12 is totally reflected at the interfaces between the inorganic particles 31 and the mediums 32. In this way, the second light reflecting portion 13 is a total-reflection type optical section based on a difference in refractive indices. The light L12, due to total reflection, is unlikely to be lost. As the interfaces between the inorganic particles 31 and the mediums 32 face in various directions, the light L12 is scattered. In the light emitting device 1, a bias of the light emitted downward from the light emitting element 11 is reduced. Consequently, the light emitting efficiency of the light emitting device 1 is improved.

Figure 4:
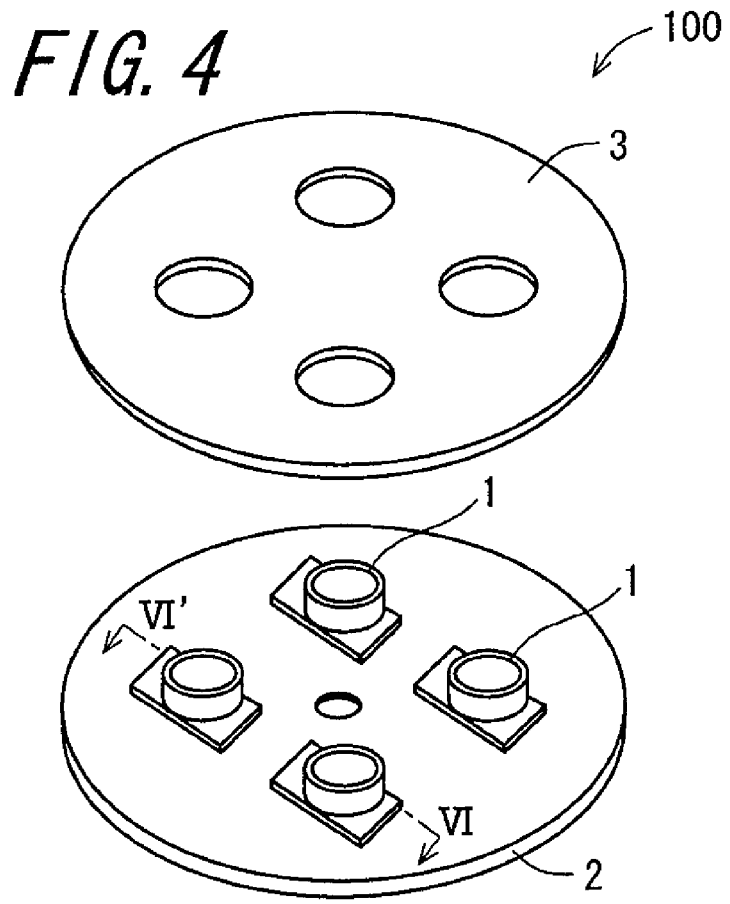
FIG. 4 illustrates an illumination device 100 according to one embodiment of the invention.
Figure 5:
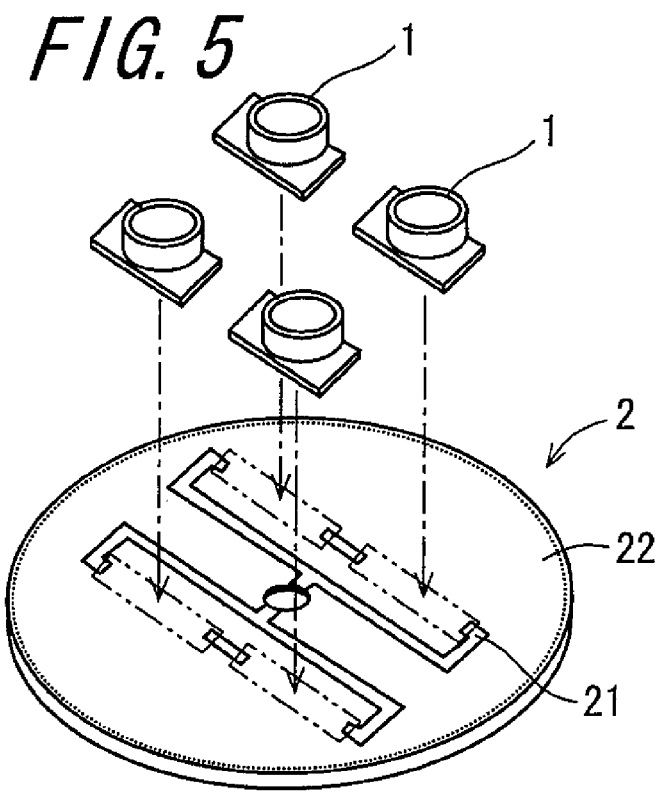
FIG. 5 illustrates a substrate 2 of FIG. 4.
Figure 6:
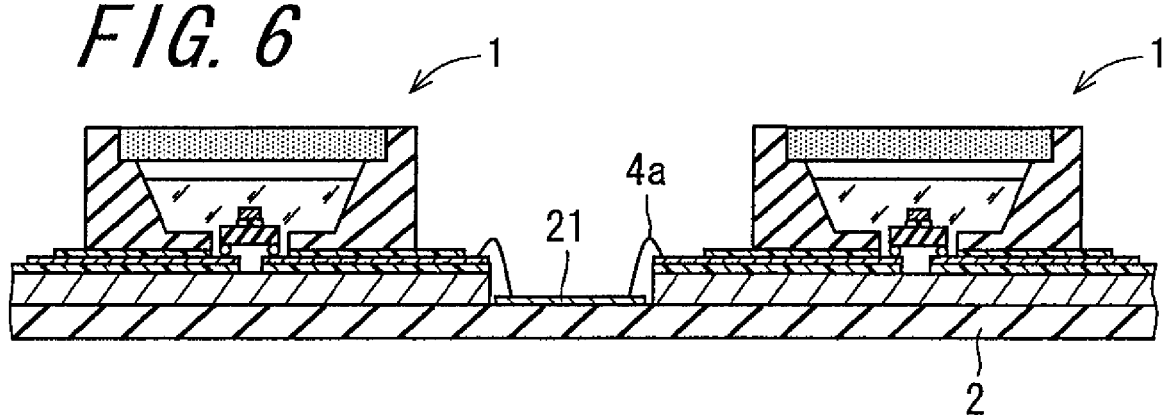
FIG. 6 illustrates a vertical cross-section along VI-VI' of FIG. 4.

An illumination device 100 according to one embodiment of the invention will be described, referring to FIG. 4. The illumination device 100 has a plurality of light emitting devices 1, a substrate 2, and a cover 3. Details of the substrate 2 will be described, referring to FIG. 5. The substrate 2 has a conductor pattern 21 electrically connected to the plurality of light emitting devices 1. The substrate 2 has a protective layer 22 formed on the conductor pattern 21. In FIG. 5, the protective layer 22 is illustrated in a perspective view. A cross-sectional structure along VI-VI' of FIG. 4 will be described, referring to FIG. 6. The plurality of the light emitting devices 1 are mounted on the substrate 2. The plurality of light emitting devices 1 are electrically connected to the conductor pattern 21 by wires 4a.

Figure 7:
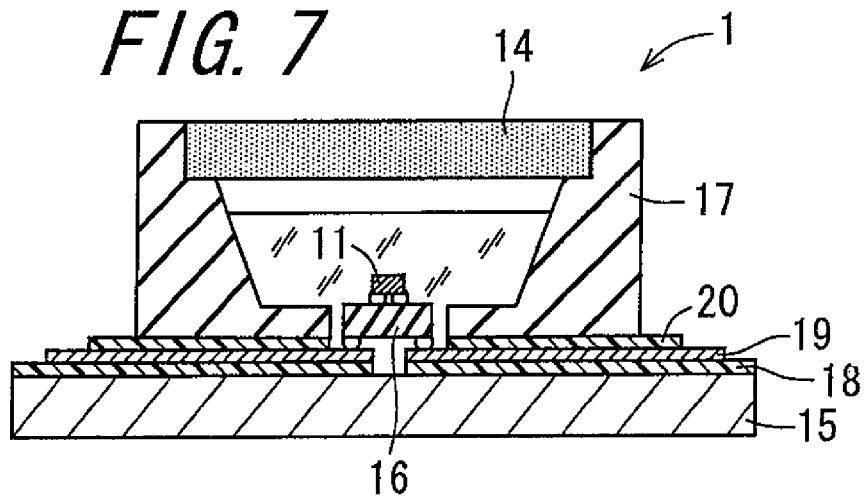
FIG. 7 illustrates a cross-section of the light emitting device 1 illustrated in FIG. 6.

A detailed structure of the light emitting device 1 will be described, referring to FIG. 7. The light emitting device 1 has the light emitting element 11, the wavelength converting member 14, and a base 15. The light emitting device 1 further has a sub-mount substrate 16 and a frame member 17. The exemplified light emitting element 11 is a light emitting diode including a semiconductor material. The light emitting element 11 is mounted on the sub-mount substrate 16 by a flip-chip connection. The light emitting element 11 is a light source which emits the primary light using drive power. The exemplified primary light has a wavelength included in the ultraviolet region.

The wavelength converting member 14, covering the light emitting element 11, has a sheet shape. The wavelength converting member 14 includes a base member having a transparence and a plurality of fluorescent particles. The "transparence" of the base member means that at least a part of wavelengths of the light emitted from the light emitting element 11 is transmitted. An example of the base member is a silicone resin. The plurality of fluorescent particles are dispersed inside the base member. The wavelength converting member 14 emits the secondary light in dependence on the primary light. The exemplified secondary light is white light.

The exemplified base 15 is made essentially of a metallic material. An example of the metallic material is copper (Cu). An insulating layer 18 is formed on the base 15. The exemplified insulating layer 18 is made essentially of a glass epoxy. A conductor pattern 19 is formed on the insulating layer 18, and is electrically connected to the light emitting element 11. A resist layer 20 is formed on the conductor pattern 19.

Figure 8:
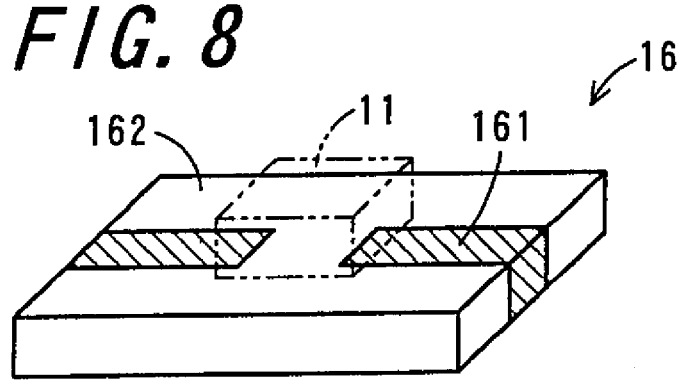
FIG. 8 illustrates a sub-mount substrate 16 illustrated in FIG. 7.

The sub-mount substrate 16 is disposed on the base 15. Details of the sub-mount substrate 16 will be described, referring to FIG. 8. In FIG. 8, the light emitting element 11 is illustrated in a see-through manner in order to show the upper surface of the sub-mount substrate 16. The sub-mount substrate 16 has a conductor pattern 161. The conductor pattern 161 is electrically connected to the light emitting element 11. The sub-mount substrate 16 has an upper surface 162 made of a ceramic sintered body. In the embodiment, the "ceramic sintered body" means ceramics having a porosity included in a range of 0.001% to 1%. An exemplified measurement method of the porosity is a mercury intrusion method using a Micromeritics Pore Sizer 9310. The upper surface 162 corresponds to the first light reflecting portion 12 illustrated in FIG. 1. The sub-mount substrate 16 is made entirely of a ceramic sintered body.

Figure 9:
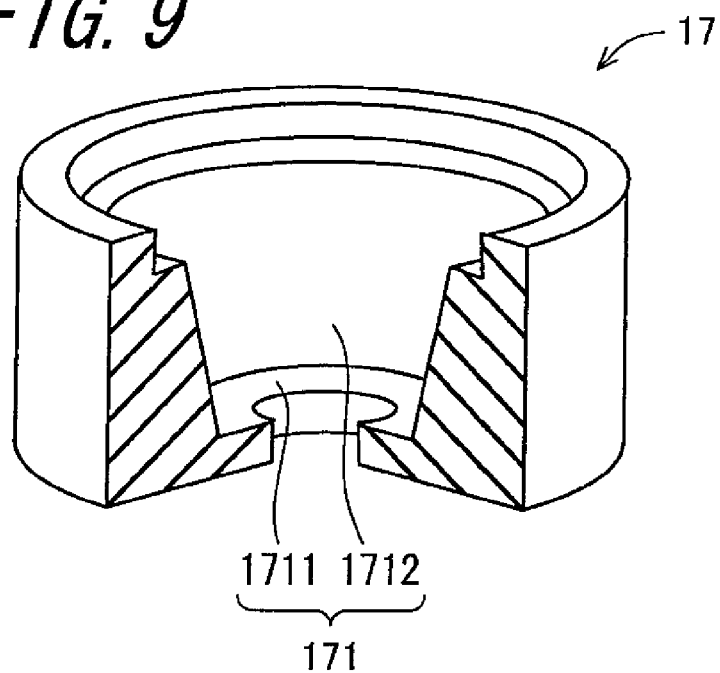
FIG. 9 illustrates a frame member 17 illustrated in FIG. 7.

The frame member 17 is disposed on the base 15, surrounding the sub-mount substrate 16. A detailed structure of the frame member 17 will be described, referring to FIG. 9. In FIG. 9, a part of the frame member 17 is omitted from the drawing in order to show the internal structure of the frame member 17. The frame member 17 has a light reflecting portion 171 made of porous ceramics. In the embodiment, the "porous ceramics" means a structure in which the plurality of ceramic particles 31 are partially integrated, and which has a plurality of pores, as illustrated in FIG. 3. The porous ceramics has a porosity included in a range of 15% to 43%. The light reflecting portion 171 has a first surface 1711 and a second surface 1712. The first surface 1711 is horizontal. The second surface 1712, being disposed above the first surface 1711, is inclined. The light reflecting portion 171 scatters the light emitted from the light emitting element 11, as illustrated in FIG. 2. As the interfaces between the ceramic particles 31 and mediums 32 face in various directions, as illustrated in FIG. 3, the light emitted from the light emitting element 11 is scattered. The light emitted from the light emitting element 11 is totally reflected at the interfaces between the ceramic particles 31 and the mediums 32. The light reflecting portion 171 is a total-reflection type optical section based on a difference in refractive indices. The light, due to total reflection, is unlikely to be lost. The light reflecting portion 171 corresponds to the second light reflecting portion 13 illustrated in FIG. 1.

The light emitting device 1 includes the sub-mount substrate 16, which has the upper surface 162 made essentially of a ceramic sintered body, and the light reflecting portion 171 made of porous ceramics. With this kind of configuration, the bias of the light radiated downward from the light emitting element 11 is reduced. Consequently, the light emitting efficiency of the light emitting device 1 is improved.

The light emitting device 1 includes the base 15 made essentially of a metallic material, and the sub-mount substrate 16 made essentially of a ceramic sintered body. Consequently, the light emitting device 1 is improved with respect to heat control.

Figure 10:
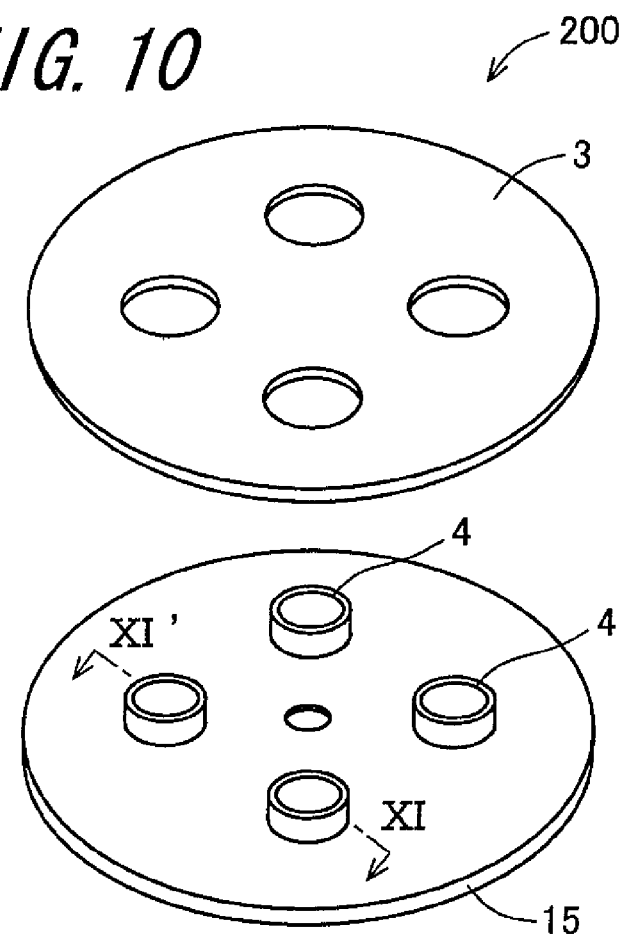
FIG. 10 illustrates an illumination device 200 according to another embodiment of the invention.

Hereinafter, an illumination device according to another embodiment of the invention will be described, referring to FIG. 10. An illumination device 200 has a base 15 and a plurality of light emitting units 4. The illumination device 200 further has a cover 3 covering the base 15. The base 15 is made essentially of a metallic material. An example of the metallic material is copper (Cu). An insulating layer 18 is formed on the base 15. The insulating layer 18 is made essentially of a glass epoxy. A conductor pattern 19 is formed on the insulating layer 18. A resist layer 20 is formed on the conductor pattern 19.

Figure 11:
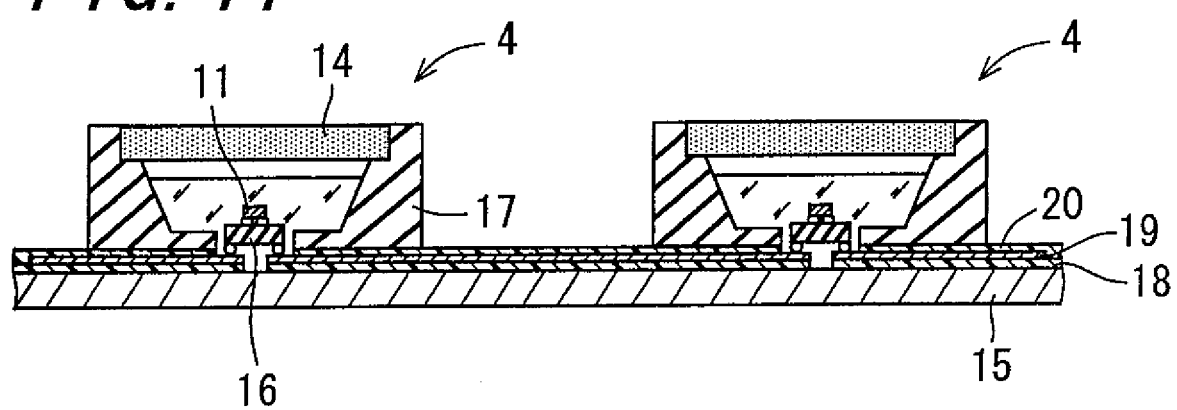
FIG. 11 illustrates a vertical cross-section along XI-XI' of FIG. 10.

The plurality of light emitting units 4 are disposed on the common base 15. As illustrated in FIG. 11, the plurality of light emitting units 4 have a plurality of light emitting elements 11, a plurality of wavelength converting members 14, and a plurality of sub-mount substrates 16. The light emitting element 11, wavelength converting member 14, and sub-mount substrate 16 have the same configurations illustrated in FIG. 7. The plurality of light emitting units 4 further have a plurality of frame members 17. The frame member 17 has the same configuration illustrated in FIG. 7.

The illumination device 200 includes the sub-mount substrate 16, which has an upper surface 162 made essentially of a ceramic sintered body, and a light reflecting portion 171 made of porous ceramics. With this kind of configuration, the bias of the light emitted downward from the light emitting element 11 is reduced. Consequently, the illumination device 200 is improved with respect to light emitting efficiency.

The illumination device 200 includes the base 15 made essentially of a metallic material, and the sub-mount substrate 16 made essentially of a ceramic sintered body. Consequently, the light emitting device 1 is improved with respect to heat control.

The plurality of light emitting units 4 are disposed on the common base 15 made essentially of a metallic material. Consequently, the illumination device 200 is improved with respect to heat control.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

The invention claimed is:

1. An illumination device, comprising:
a substrate having a conductor pattern;
a plurality of bases disposed on the substrate and including a metallic material;
a plurality of sub-mount substrates disposed on the plurality of bases and each having an upper surface made of a ceramic sintered body;
a plurality of frame members disposed on the plurality of bases, each surrounding one of the sub-mount substrates and having a light reflecting portion made of porous ceramics;
a plurality of light emitting elements mounted on the plurality of sub-mount substrates and electrically connected to the conductor pattern; and
a plurality of wavelength converting members each covering one of the light emitting elements and one of the light reflecting portions
wherein each of the light reflecting portions has a first surface facing the plurality of wavelength converting members, and a second surface disposed above the first surface.

2. The illumination device according to claim 1, wherein each of the plurality of sub-mount substrates is made entirely of a ceramic sintered body.

\* \* \* \* \*